United States Patent
Weyers et al.

(10) Patent No.: US 7,688,070 B2
(45) Date of Patent: Mar. 30, 2010

(54) ELEVATED ENDRING BIRDCAGE ANTENNA FOR MRI APPLICATIONS

(75) Inventors: Daniel J. Weyers, Brookfield, WI (US); David Keren, Milwaukee, WI (US); Kevin Kinsey, Waukesha, WI (US); Ed B. Boskamp, Menomonee, WI (US)

(73) Assignee: General Electric Company, Schnectady, NY (US)

( * ) Notice: Subject to any disclaimer, the term of this patent is extended or adjusted under 35 U.S.C. 154(b) by 199 days.

(21) Appl. No.: 10/707,045

(22) Filed: Nov. 18, 2003

(65) Prior Publication Data
US 2005/0107684 A1    May 19, 2005

(51) Int. Cl.
*G01V 3/00* (2006.01)

(52) U.S. Cl. ............... 324/318; 324/322; 324/306; 324/309; 324/307; 324/314; 600/407; 600/410; 600/422; 600/421

(58) Field of Classification Search ............... 600/407, 600/410–423; 324/307, 309, 318, 322, 314, 324/306
See application file for complete search history.

(56) References Cited

U.S. PATENT DOCUMENTS

| | | | |
|---|---|---|---|
| 5,194,811 A * | 3/1993 | Murphy-Boesch et al. | 324/322 |
| 5,202,635 A * | 4/1993 | Srinivasan et al. | 324/322 |
| 6,344,745 B1 * | 2/2002 | Reisker et al. | 324/318 |
| 6,396,271 B1 * | 5/2002 | Burl et al. | 324/318 |
| 6,788,058 B1 * | 9/2004 | Petropoulos et al. | 324/318 |

OTHER PUBLICATIONS

Patent Abstracts of Japan 08187235, for Japanese Application No. 07001825.*

* cited by examiner

*Primary Examiner*—Brian Casler
*Assistant Examiner*—John F Ramirez
(74) *Attorney, Agent, or Firm*—Peter Vogel

(57) ABSTRACT

An imaging coil (12) includes multiple end rings (52). A center ring (53) extends parallel to and is coupled between the end rings (52). Multiple legs (86) are coupled between the end rings (52) and the center ring (53). The end rings (52) may have a first radius (R1) that is greater than a second radius (R2) of the center ring (53). The imaging coil (12) may include more than 16 legs. The imaging coil (12) may include multiple capacitor groupings (98) coupled along the end rings (52), each capacitor grouping (98) has multiple capacitors (102) with a coverage area width (W) greater than 5.0 cm. The center ring (53) may be coupled to a ground reference (110) and has low impedance such that the center ring (53) is effectively shorted to the ground reference (110).

21 Claims, 3 Drawing Sheets

ELEVATED ENDRING BIRDCAGE ANTENNA FOR MRI APPLICATIONS

BACKGROUND OF INVENTION

The present invention relates generally to magnetic resonance (MR) imaging systems, and more particularly, to an apparatus and system for performing high field MR scanning and imaging of a body. In magnetic resonance imaging, a patient is typically positioned within a strong, temporally constant or static magnetic field, referred to as the B0 field. A time series of magnetic field gradient pulses, for encoding spatial location, are applied across a region of interest within the magnetic field. Concurrently, radio frequency (RF) pulses are applied to induce and manipulate the magnetic resonance of magnetic dipoles in the region of interest. An assembly of RF transmitting and receiving coils is positioned over portions of the patient to excite and receive the radio frequency magnetic resonance signals within the region of interest. The RF magnetic field, generated by the RF pulses, is referred to as the B1 field.

The MR imaging systems that use a low B0 field (0.5 T or less) have a low B1 field frequency or Larmor frequency. As such, the electric field associated with the B1 field is negligible and the interaction between the B1 field and the patient can be neglected.

Due to the signal-to-noise ratio (SNR) limitations of a low B0 field MR imaging system, MR imaging systems using a high B0 field (3.0 T or greater) have been developed. However, as the strength of the B0 field increases, the frequency of the B1 field increases linearly and at such a high frequency (100 MHz or greater), the interaction between the B1 field and the patient can no longer be neglected. This interaction is caused by the effective wavelength of the B1 field, at the higher frequencies, being comparable to or even smaller than the dimension of the human body.

Such a strong interaction substantially degrades the homogeneity of the B1 field and thus negatively affects the image quality of the system and can cause an increase in image shading. Also, since the varying electric field strength associated with the B1 field increases with the inhomogeneity of the B1 field, the specific energy absorption rate of the patient increases or in other words patient heating increases. Increased patient heating can result in abrasions or burns to patient tissue. In addition, the high static fields reduce coil efficiency and increase power requirements.

Thus, there exists a need for an improved apparatus and system for performing high field MR scanning and imaging of a body that minimizes interaction between the electromagnetic (E) and B fields and the patient, maintains or improves image quality, maximizes slice coverage, and allows for increased imaging speeds.

SUMMARY OF INVENTION

The present invention provides an imaging coil that includes multiple end rings. A center ring extends parallel to and is coupled between the end rings. Multiple legs are coupled between the end rings and the center ring. The end rings may have a first radius that is greater than a second radius of the center ring. The imaging coil may include more than 16 legs. The imaging coil may include multiple capacitor groupings coupled along the end rings, each capacitor grouping having multiple capacitors with a coverage area width greater than 5.0 cm. The center ring may be coupled to a ground reference and may have low impedance such that the center ring is effectively shorted to the ground reference.

The embodiments of the present invention provide several advantages. One advantage provided by an embodiment of the present invention is the provision of an imaging coil having end rings with a radius that is greater than a radius of a center ring. In so doing, the stated embodiment reduces inductance of and enables capacitance to increase in the end rings. The stated embodiment also increases the impedance between a patient and the end-rings, thus, minimizing electromagnetic (E)-fields to and resulting heating effects of a patient.

Another advantage provided by another embodiment of the present invention is the provision of an imaging coil that includes more than 16 legs. The increased number of legs reduces phase delays around the end rings and ensures ideal sinusoidal current distributions azimuthally about the coil. The increased number of legs also ensures proper quadrature isolation, improved homogeneity, reduced power consumption, while being driven by a minimal number of orthogonal ports, which in one embodiment of the present invention only two orthogonal ports are used.

Furthermore, another advantage provided by an embodiment of the present invention is the provision of an imaging coil that has multiple capacitor groupings with a coverage area width greater than 5.0 cm. As such, the stated embodiment further reduces E-fields within an imaging system by spreading the current density.

Moreover, another advantage provided by an embodiment of the present invention is the provision of an imaging coil that has a center ring, which is coupled to a ground reference and has low impedance such that the center ring is effectively shorted to the ground reference. Shorting the center ring ensures symmetry of the coil end-to-end.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Figure 1:
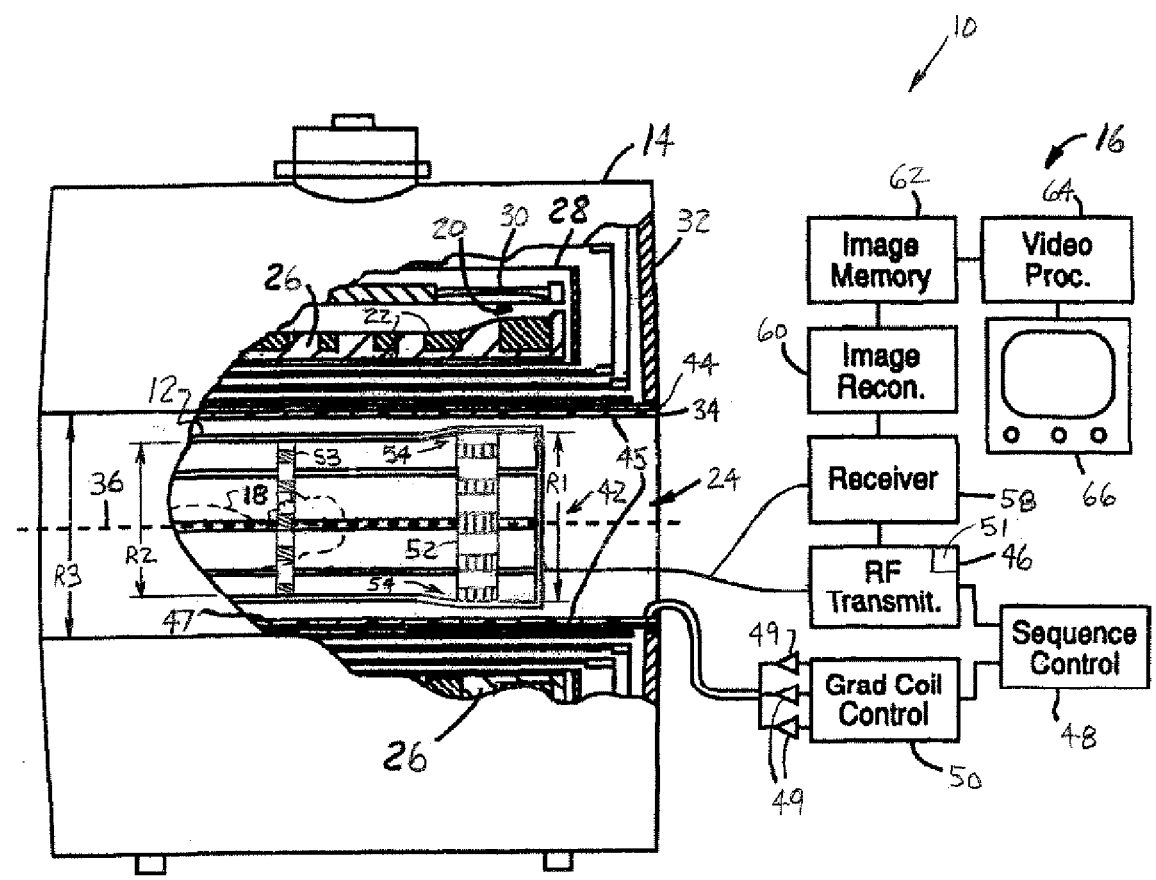
FIG. 1 is a cross-sectional side and block diagrammatic view of a magnetic resonance (MR) imaging system utilizing an imaging system body coil in accordance with an embodiment of the present invention.

In the following figures the same reference numerals will be used to refer to the same components. While the present invention is described with respect to an apparatus and system for performing high field magnetic resonance (MR) scanning and imaging of a body, the following apparatus and system is capable of being adapted for various purposes including: MR imaging systems, MR spectroscopy systems, and other similar applications known in the art.

In the following description, various operating parameters and components are described for one constructed embodiment. These specific parameters and components are included as examples and are not meant to be limiting.

Referring now to FIG. 1, a cross-sectional side and block diagrammatic view of a MR imaging system 10 utilizing an imaging system body coil 12 in accordance with an embodiment of the present invention is shown. The imaging system 10 includes a static magnet structure 14 (a cylindrical structure) and a signal processing system 16. The signal processing system 16 is coupled to the imaging coil 12 and reconstructs an image for a region of interest of a patient 18 in response to radio frequency (RF) MR signals, as is further described below.

The static magnet structure 14 includes a superconducting magnet 20 that has a plurality of superconducting magnetic field coils 22, which generate a temporally constant magnetic field along a longitudinal axis (z-axis) of a central bore (patient bore) 24. The superconducting magnet coils 22 are supported by a superconducting magnet coil support structure 26 and received in a toroidal helium vessel or can 28.

A main magnetic field shield coil assembly 30 generates a magnetic field that opposes the field generated by the superconducting magnet coils 22. A toroidal vacuum vessel 32 includes a cylindrical member 34 that defines the patient bore 24 and extends parallel to a longitudinal axis 36. The patient bore 24 has an RF coil assembly 42 mounted therein. The RF coil assembly 42 includes the primary RF coil or imaging coil 12 and an RF shield 44. On a first exterior side 45 of the cylindrical member 34 is a magnetic gradient coil assembly 47.

The signal processing system 16 includes a driver or RF transmitter 46 that is coupled to a sequence controller 48 and the imaging coil 12. The RF transmitter 46 may be digital. The sequence controller 48 controls a series of current pulse generators 49 via a gradient coil controller 50 that is connected to the magnetic gradient coil assembly 47. The RF transmitter 46 in conjunction with the sequence controller 48 generates a series of spatially located RF signals or encoded magnetic field gradient pulses. The magnetic gradient pulses are applied across a region of interest within the magnetic field to excite and manipulate the magnetic resonance in selected dipoles of the region of interest. The region of interest may be a portion of the patient 18 within the patient bore 24. The transmitter 46 includes a pulsed power amplifier 51.

The imaging coil 12 resides within the patient bore 24 and is positioned over at least a portion of the patient 18. In one embodiment of the present invention, the imaging coil 12 is of a "Birdcage Resonator" type. The imaging coil 12 performs as a transmitter and as a receiver for the excitation and reception of the magnetic resonance within a selected volume of interest of the patient bore 24. The imaging coil 12 receives the RF magnetic resonance signals that emanate from the region of interest.

Figure 2:
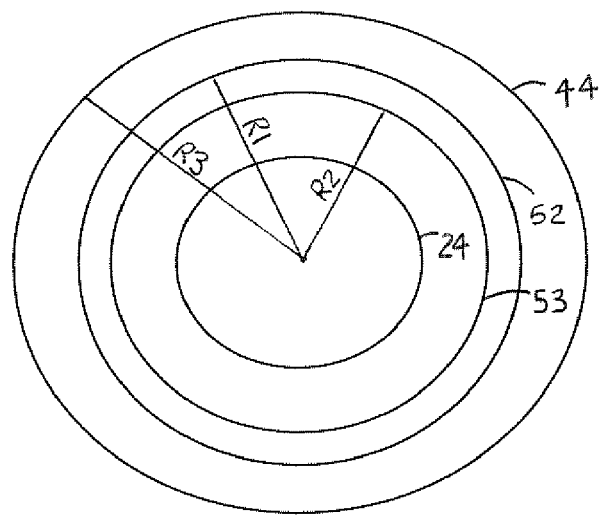
FIG. 2 is a cross-sectional view of the imaging system body coil in accordance with an embodiment of the present invention.

Referring now also to FIG. 2, where a cross-sectional view of the imaging coil 12 in accordance with an embodiment of the present invention is shown. The imaging coil 12 has "elevated" end rings 52 (only one is shown in FIG. 1). In being elevated, the end rings 52 have a larger radius than that of a center ring 53. This is illustrated by a first radius R1, which corresponds with the radius of the end rings 52, and a second radius R2, which corresponds with the radius of the center ring 53. The first radius R1 is smaller than a third radius R3 of the RF shield 44. Thus, the end rings 52 are closer to the RF shield 44 and farther away from the patient bore 24 than the center ring 53. The end rings 52 provide air pockets 54 or an increased distance between the imaging coil 12 and the patient bore 24. Increased distance between the imaging coil 12 and the patient bore 24, aids in preventing heating of the patient 18. The imaging coil 12 is described in further detail below with respect to the embodiments of FIGS. 3 and 4.

By elevating the end rings 52, inductance is reduced, capacitance is increased, and Z magnetic fringe fields that negatively affect MR imaging are also reduced. Z magnetic fringe fields can cause radiation losses from the ends of the imaging coil 12. Elevation of the end rings 52 also provides the air pockets 54 between the end rings 52 and the patient bore 24, which increases impedance therebetween and reduces the specific energy absorption rate of the patient 18. Increased impedance reduces electromagnetic (E)-fields or capacitance coupling to and heating of the patient 18. In one embodiment of the present invention, the first radius R1 is approximately 31.5 cm, the second radius R2 is approximately 30.5 cm, and the third radius R3 is approximately 32.5 cm.

A RF receiver 58 is coupled to the imaging coil 12 and demodulates the magnetic resonance signals emanating from the examined portion of the patient 18. An image reconstruction apparatus 60 is coupled to the receiver 58 and reconstructs the received magnetic resonance signals into an electronic image representation that is stored in an image memory 62. A video processor 64 converts the stored electronic images into an appropriate format for display on a video monitor 66.

Figure 3:
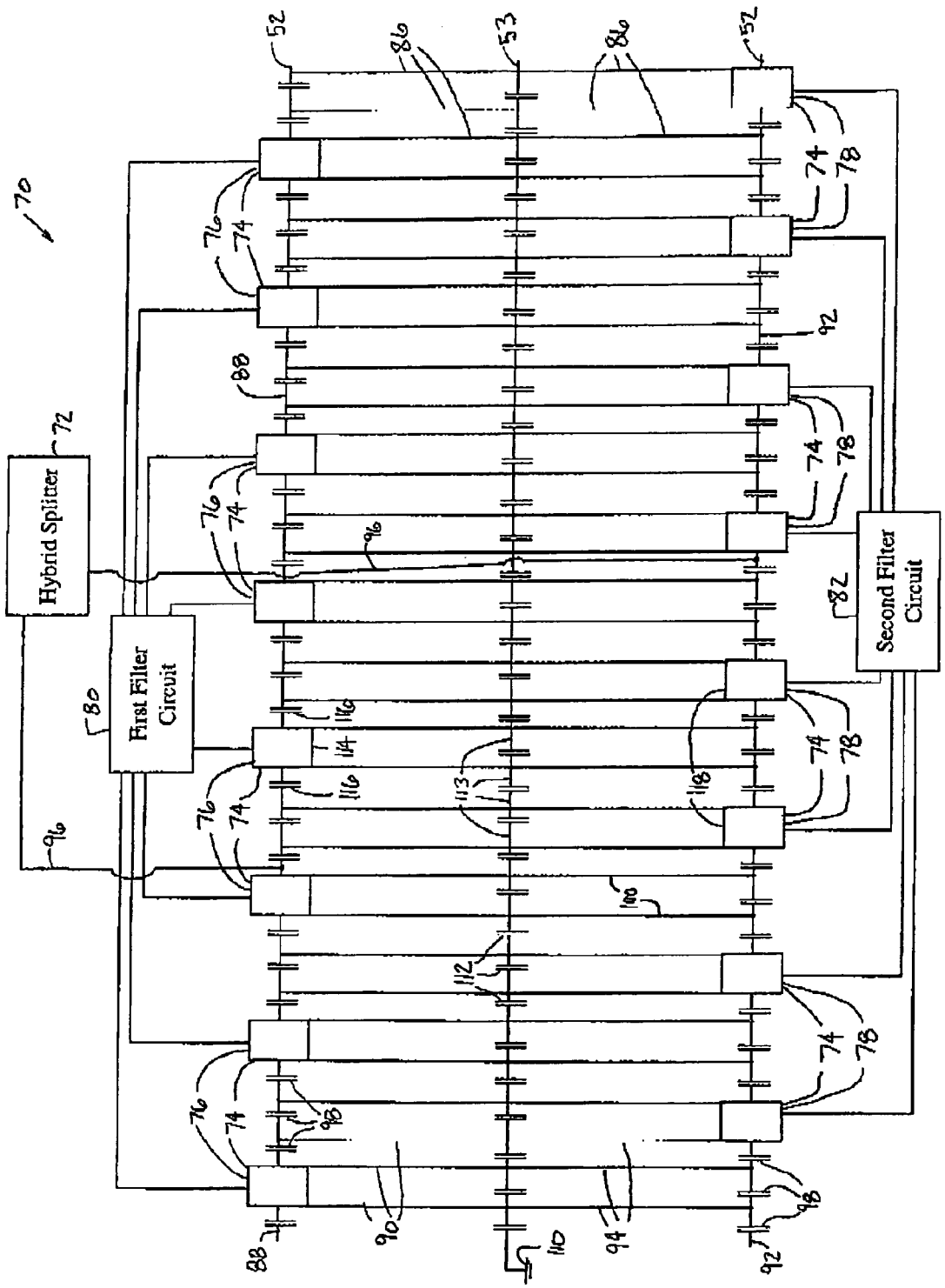
FIG. 3 is a schematic and block diagrammatic view of the imaging system body coil in accordance with an embodiment of the present invention.

Referring now to FIG. 3, a schematic and block diagrammatic view of an imaging coil circuit 70 in accordance with an embodiment of the present invention is shown. The imaging coil circuit 70 includes the imaging coil 12, which is coupled to and signals generated therefrom are received by a hybrid splitter 72. The hybrid splitter 72 may be part of the transmitter 46 and splits the transmitted encoded magnetic field gradient pulses such that they can be applied to each of the end rings 52. The decoupling circuits 74 switch the imaging coil 12 into and out of resonance. The decoupling circuits 74 include forward resonance circuits 76 and rearward resonance circuits 78. The forward decoupling circuits 76 are coupled to a first RF filter circuit 80 and rearward decoupling circuits 78 are coupled to a second RF filter circuit 82. The filter circuits 80 and 82 filter the DC lines from RF before being received by the DC control circuits of the system 10. The filter circuits 80 and 82 are utilized to protect against the high power RF signals.

The imaging coil 12 is elliptical in shape along Z and is in the form of a ladder circuit. The ladder circuit is of cylindrical form and has axially-directed runners or legs 86 extending between a pair of conductive rings 52, referred to as the "end rings", located at the peripheries of the cylinder, and extending azimuthally thereabout. Although, the imaging coil 12 is shown as being of a high pass birdcage type, the imaging coil 12 may be modified to be of a low pass type or of another type known in the art. A forward end ring 88 is coupled to a series of forward legs 90 and a rearward end ring 92 is coupled to a series of rearward legs 94. Each series of legs 90 and 94 are coupled to the center ring 53. Although a pair of end rings and a single center ring are shown, any number of end rings and center rings may be incorporated into the imaging coil 12 with or without legs therebetween.

The imaging coil 12 does not require more than two driving ports to ensure quadrature or circular polarization and homogeneous transmission even under asymmetric patient loading conditions. This is due to low E-field interactions between the imaging coil 12 and the patient 18 and the provision of good coil symmetry. Two port drives are shown and represented by cables 96, which are coupled between the hybrid splitter 72 and the end rings 52. The cables 96 may be in the form of balun-less drive cables, which eliminate stray currents on the shields of the cables 96.

Each series of legs 90 and 94 include more than approximately 16 legs, which is a greater number of legs than that of prior art body coils. The increased number of legs aids in distribution of the capacitance and current density of the imaging coil 12 and enables an increase in tuning capacitance thereof. Thus, voltages and local E-fields near the capacitor groupings 98 are reduced. Although each series of legs 90 and 94 are shown as having 32 legs, any number of legs may be utilized.

Figure 4:
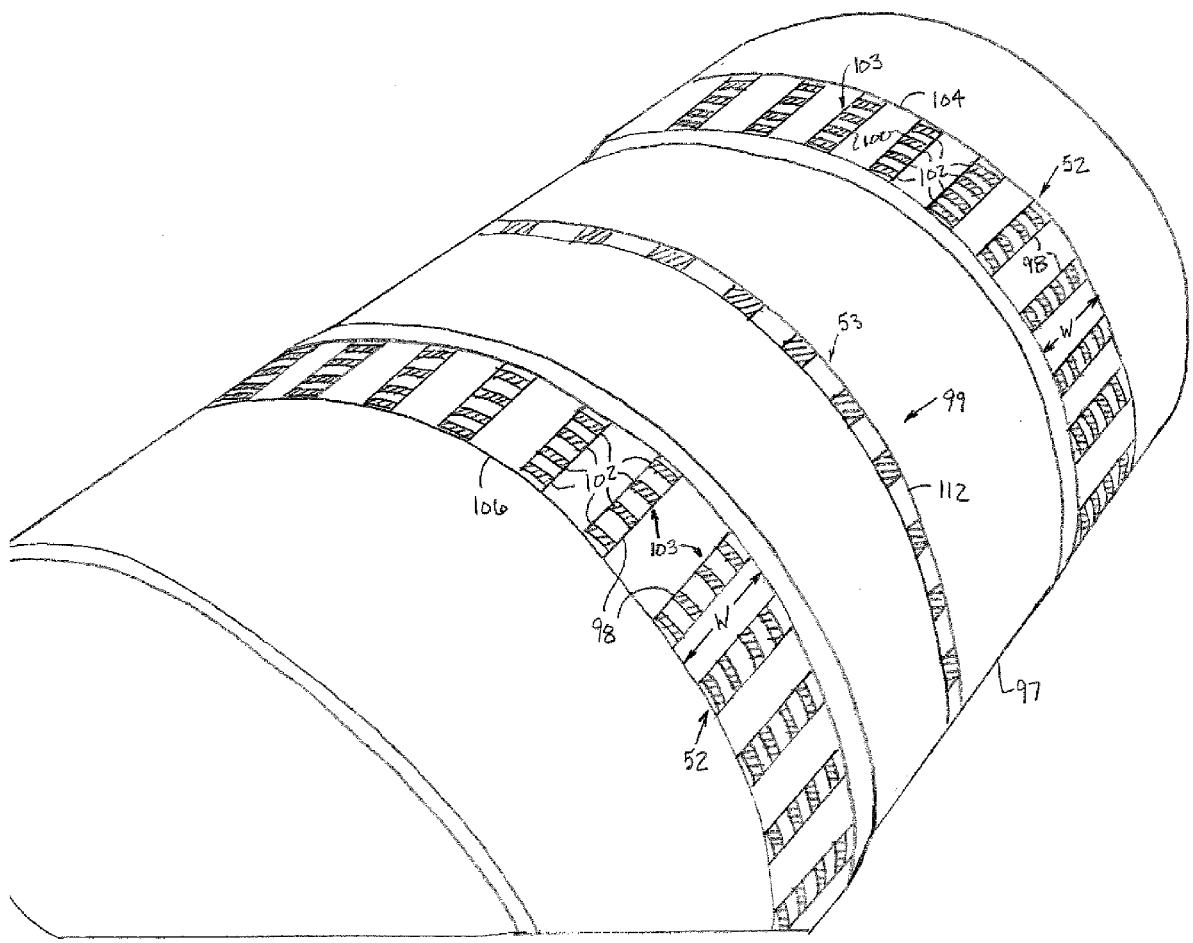
FIG. 4 is a perspective view of the imaging system body coil in accordance with an embodiment of the present invention.

Referring now also to FIG. 4, a perspective view of the imaging coil 12 in accordance with an embodiment of the present invention is shown. The imaging coil 12 is shown in cylindrical form. The end rings 52 extend around the cylinder 97 towards the front or rear of the cylinder 97. The center ring 53 extends around the middle portion 99 of the cylinder 97.

Each pair of adjacent legs, such as legs 100, has the capacitor groupings 98 therebetween. In FIG. 3, each capacitor grouping 98 is represented by a single capacitor, whereas in FIG. 4 each capacitor grouping 98 is shown and has four capacitors 102 coupled in parallel. Any number of capacitors may exist within each capacitor grouping 98. The capacitor groupings 98 include a forward set of capacitor groupings 104 and a rearward set of capacitor groupings 106.

The capacitors 102, within each capacitor grouping, are "spread out" along the longitudinal axis 36 such that the coverage area 103 of the capacitors 102 has a width W that is approximately greater than 5.0 cm, which is also greater than that of prior art body coils. The width of the groupings 104 and 106 may be approximately equal, as shown, or may be different. Increased width of the capacitor groupings 98 further distributes RF currents and reduces generation of E-fields. Also, the capacitors 102 are positioned farther away from the patient bore 24, which decreases size of the local E-fields associated therewith. Wider end rings 52 exhibit lower inductance between the capacitors 98, which enables higher capacitance in the endrings 52.

The center ring 53 is coupled between the legs 86 and extends parallel to the end rings 52. Although the length of the center ring 53 is shown in FIG. 3 as being approximately equal to the length of the end rings 52, the length of the center ring 53 is actually smaller than the length of the end rings 52, as stated above.

The center ring 53 is coupled to a ground reference 110, which has low impedance, such that the center ring 53 is effectively "shorted" to the ground reference 110. The center ring 53 includes a series of capacitors 112, which are coupled between the legs 86. As shown in FIG. 3, the capacitors 112 are coupled together via connections 113 therebetween. Configured as such, the center ring 53, like the end rings 52, is substantially centered around a common axis, as is shown in FIGS. 1 and 2. The capacitors 112 have low impedance at frequency levels of approximately greater than or equal to 120 MHz. The center ring 53 may have any number of capacitors. Shorting the center ring 53 ensures symmetry of the imaging coil 12 end-to-end. Shorting the center ring 53 also allows for use of balun-less drive cables between the splitter 72 and the end rings 52.

Each decoupling circuit 74 has associated adjacent capacitors, which are generally coupled to decoupling circuits on an opposing end ring. For example, as shown in FIG. 3, decoupling circuit 114, on the forward end ring 88, has associated capacitors 116, which are coupled to decoupling circuits 118.

The embodiments of the present invention provide an imaging system body coil with an increased number of legs, wider end rings, and elevated end rings, which eliminates losses associated with the B1 field, reduces voltages, and lowers E-fields associated therewith.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

The invention claimed is:

1. A drivable imaging coil comprising:
   a pair of end rings substantially centered around a common axis and spaced apart along the length of said axis;
   a pair of balun-less drive cables respectively coupled to said end rings;
   a central ring substantially centered around said axis so as to be parallel to and situated between said end rings;
   a plurality of legs coupled between said pair of end rings and said central ring; and
   a plurality of capacitor groupings coupled along said pair of end rings, wherein each of said capacitor groupings includes a plurality of capacitors with a group coverage area having a width that is greater than 5.0 cm;
   wherein each of said end rings has a radius that is greater than the radius of said central ring, and said central ring is grounded and has a low impedance such that said central ring is effectively shorted to ground when coupled to ground during operation of said imaging coil.

2. A drivable imaging coil as set forth in claim 1, wherein at least one of said end rings is elevated.

3. A drivable imaging coil as set forth in claim 1, wherein each radius of said end rings is at least 1.0 cm greater in length than said radius of said central ring.

4. A drivable imaging coil as set forth in claim 1, wherein each radius of said end rings is within a range defined from 30.5 cm and to 32.5 cm.

5. A drivable imaging coil as set forth in claim 1, wherein said radius of said central ring is less than 31.5 cm.

6. A drivable imaging coil as set forth in claim 1, wherein said plurality of legs includes more than 16 legs.

7. A drivable imaging coil as set forth in claim 1, wherein said pair of end rings, said central ring, and said plurality of legs are configured so as to form a birdcage-style imaging coil.

8. A drivable imaging coil as set forth in claim 1, wherein said plurality of capacitors is spread out along said axis so as to form said group coverage area.

9. A drivable imaging coil comprising:
   a pair of end rings substantially centered around a common axis and spaced apart along the length of said axis;
   a pair of balun-less drive cables respectively coupled to said end rings;
   at least one central ring substantially centered around said axis so as to be parallel to and situated between said end rings, said at least one central ring including a plurality of capacitors having low impedance at frequency levels of at least 120 MHz; and
   a plurality of legs coupled between said pair of end rings and said at least one central ring;
   wherein said plurality of legs includes (i) a first series of legs coupled between one of said end rings and said at least one central ring and (ii) a second series of legs coupled between the other one of said end rings and said at least one central ring; and
   wherein each of said end rings respectively has a radius that is greater than each respective radius of said at least one central ring, and at least one said central ring is grounded-and-has a low impedance such that said central ring is effectively shorted to ground when coupled to ground during operation of said imaging coil.

10. A drivable imaging coil as set forth in claim 8, wherein said pair of end rings, said at least one central ring, and said plurality of legs are configured so as to form a birdcage-style imaging coil.

11. A drivable imaging coil comprising:
a first plurality of end rings substantially centered around a common axis and situated along the length of said axis;
a second plurality of end rings substantially centered around said axis and situated along the length of said axis so as to be spaced apart from said first plurality of end rings;
a plurality of balun-less drive cables coupled to said first and second plurality of end rings;
at least one central ring substantially centered around said axis so as to be parallel to and situated between said first and second plurality of end rings, said at least one central ring includes a plurality of capacitors having low impedance at frequency levels of at least 120 MHz; and
a plurality of legs coupled between said first and second plurality of end rings and said at least one central ring;
wherein each of said first and second plurality of end rings respectively has a radius that is greater than each respective radius of said at least one central ring, and at least one said central ring is structurally adapted for being coupled to a ground reference during operation of said imaging coil, said central ring having a low impedance such that said central ring is effectively shorted to a ground reference when coupled to said ground reference during operation of said imaging coil;
and said plurality of legs are configured so as to form a birdcage-style imaging coil.

12. A drivable imaging coil as set forth in claim 11, wherein said first and second plurality of end rings, said at least one central ring, and said plurality of legs are configured so as to form a birdcage-style imaging coil.

13. A drivable imaging coil comprising:
a plurality of end rings;
a plurality of balun-less drive cables coupled to said plurality of end rings;
at least one central ring situated both parallel to and between said plurality of end rings with at least one said central ring being grounded and having a low impedance such that said central ring is effectively shorted to ground when coupled to ground during operation of said imaging coil and having a low impedance so that said central ring is effectively shorted, said at least one central ring includes a plurality of capacitors having low impedance at frequency levels of at least 120 MHz; and
a plurality of legs coupled between said plurality of end rings and said at least one central ring.

14. A drivable imaging coil as set forth in claim 13, wherein said plurality of end rings, said at least one central ring, and said plurality of legs are configured so as to form a birdcage-style imaging coil.

15. A drivable imaging coil as set forth in claim 13, wherein said plurality of balun-less drive cables are adapted for being coupled to a radio-frequency (RF) signal transmitter and thereby communicating gradient pulses from said RF signal transmitter and to said plurality of end rings.

16. A magnetic resonance imaging (MRI) system having a patient bore, said MRI system comprising:
a radio-frequency (RF) shield; and
a drivable imaging coil at least partially surrounded by said RF shield and including:
(i) a pair of end rings substantially centered around a common axis and spaced apart along the length of said axis;
(ii) a pair of balun-less drive cables respectively coupled to said pair of end rings;
(iii) a central ring substantially centered around said axis so as to be parallel to and situated between said pair of end rings, said central ring having a plurality of capacitors and a plurality of connections there between, said plurality of capacitors having low impedance at frequency levels of at least 120 MHz; and
(iv) a plurality of legs coupled between said pair of end rings and said central ring;
wherein each of said end rings has a radius that is greater than the radius of said central ring, and said central ring is grounded and has a low impedance such that said central ring is effectively shorted to ground when coupled to ground during operation of said imaging coil.

17. An MRI system as set forth in claim 16, said MRI system further comprising a driver coupled to said pair of end rings via said pair of balun-less drive cables.

18. An MRI system as set forth in claim 16, wherein said end rings are closer to said RF shield than is said central ring.

19. An MRI system as set forth in claim 16, wherein said end rings are farther away from the patient bore of said MRI system than is said central ring.

20. An MRI system as set forth in claim 16, wherein said plurality of legs includes more than 16 legs.

21. An MRI system as set forth in claim 16, said MRI system further comprising a plurality of capacitor groupings coupled along said pair of end rings, wherein each of said capacitor groupings includes a plurality of capacitors with a group coverage area having a width that is greater than 5.0 cm.

\* \* \* \* \*